US012652749B2

(12) United States Patent
Tzinares et al.

(10) Patent No.: US 12,652,749 B2
(45) Date of Patent: Jun. 9, 2026

(54) ELECTRONICS MODULE IMMERSION SEALING WITH ELECTROMAGNETIC COMPATIBILITY MITIGATION

(71) Applicant: Harman International Industries, Incorporated, Stamford, CT (US)

(72) Inventors: Alexander Tzinares, Ann Arbor, MI (US); Jose Rodrigo Molotla, Stamford, CT (US)

(73) Assignee: Harman International Industries, Incorporated, Stamford, CT (US)

( * ) Notice: Subject to any disclaimer, the term of this patent is extended or adjusted under 35 U.S.C. 154(b) by 161 days.

(21) Appl. No.: 18/444,087

(22) Filed: Feb. 16, 2024

(65) Prior Publication Data

US 2024/0284588 A1      Aug. 22, 2024

Related U.S. Application Data

(60) Provisional application No. 63/446,312, filed on Feb. 16, 2023.

(51) Int. Cl.
| | |
|---|---|
| *H05K 5/02* | (2006.01) |
| *H05K 1/02* | (2006.01) |
| *H05K 5/06* | (2006.01) |

(52) U.S. Cl.
CPC ......... *H05K 1/0215* (2013.01); *H05K 5/0217* (2013.01); *H05K 5/06* (2013.01)

(58) Field of Classification Search
USPC ................ 361/799, 816, 818, 807, 809, 810
See application file for complete search history.

(56) References Cited

U.S. PATENT DOCUMENTS

| | | | | |
|---|---|---|---|---|
| 5,920,984 | A | * | 7/1999 | Persson ................ H05K 9/0039 |
| | | | | 29/842 |
| 2007/0109730 | A1 | * | 5/2007 | Shigyo ................. H05K 5/0052 |
| | | | | 361/600 |
| 2009/0129035 | A1 | * | 5/2009 | Kojima ................ H05K 5/0069 |
| | | | | 361/752 |

(Continued)

FOREIGN PATENT DOCUMENTS

| | | | | | |
|---|---|---|---|---|---|
| JP | 2003258451 | A | * | 9/2003 | ............... H05K 5/06 |
| JP | 3922626 | B2 | * | 5/2007 | ............... H05K 5/02 |

(Continued)

*Primary Examiner* — Hung S. Bui
(74) *Attorney, Agent, or Firm* — Brooks Kushman P.C.

(57)      ABSTRACT

In at least one embodiment, an electronic module includes a first housing, a second housing, a printed circuit board (PCB), a ground contact, and a sealant. The first housing includes a first receiving portion. The second housing includes a second receiving portion, the second housing being coupled to the first housing defining a cavity positioned between the first receiving portion and the second receiving portion. The printed circuit board (PCB) is positioned between the first housing and the second housing therein to receive a plurality of electronics. The ground contact is positioned on the PCB and within the cavity contacting the first receiving portion and the second receiving portion. The ground contact mitigates electromagnetic interference (EMI) generated from the plurality of electronics. The sealant is positioned within the cavity and adjacent to the ground contact to prevent debris or liquid from contacting the plurality of electronics.

20 Claims, 4 Drawing Sheets

(56)　　　　　References Cited

U.S. PATENT DOCUMENTS

| | | | | |
|---|---|---|---|---|
| 2015/0282362 A1 * | 10/2015 | Nuriya | ................ | H05K 5/0056 |
| | | | | 361/728 |
| 2017/0257964 A1 * | 9/2017 | Ishikawa | ............... | H05K 5/065 |
| 2019/0299881 A1 * | 10/2019 | Saito | .................... | H05K 5/062 |
| 2022/0030737 A1 * | 1/2022 | Akiyama | ........... | H01L 23/3677 |

FOREIGN PATENT DOCUMENTS

| | | | | | |
|---|---|---|---|---|---|
| JP | 2008263081 A | * | 10/2008 | ......... | H05K 7/20127 |
| JP | 2011031696 A | * | 2/2011 | ............. | H05K 5/02 |
| JP | 2019016689 A | * | 1/2019 | ............. | H05K 5/00 |
| JP | 2019110150 A | * | 7/2019 | ............. | H05K 5/00 |

* cited by examiner

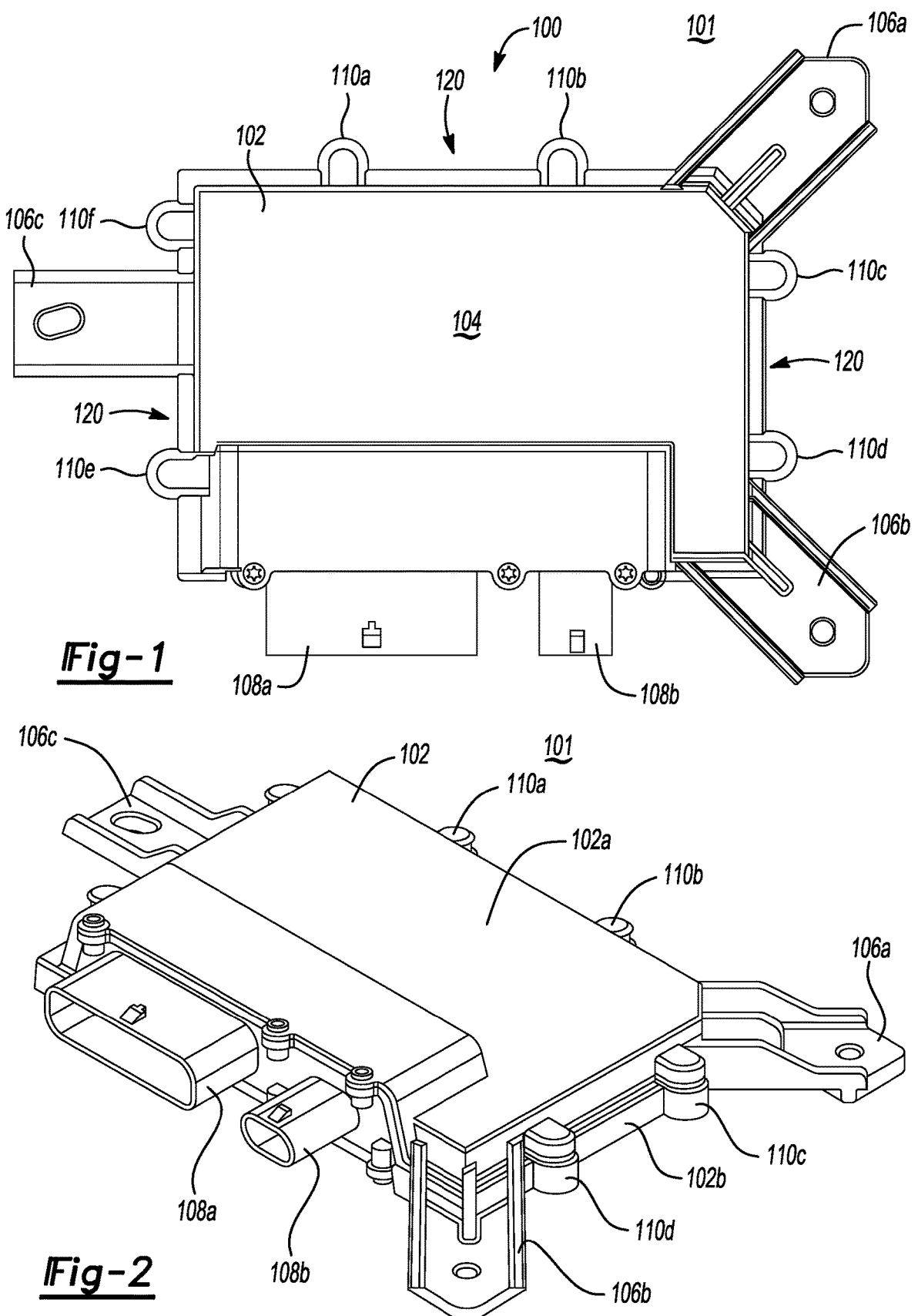
_Fig-1_
_Fig-2_

ELECTRONICS MODULE IMMERSION SEALING WITH ELECTROMAGNETIC COMPATIBILITY MITIGATION

CROSS-REFERENCE TO RELATED APPLICATIONS

This application claims the benefit of U.S. provisional application Ser. No. 63/446,312 filed Feb. 16, 2023, the disclosure of which is hereby incorporated in its entirety by reference herein.

TECHNICAL FIELD

Aspects disclosed herein generally relate to an electronics module that provides immersion sealing while providing electromagnetic compatibility (EMC) mitigation.

BACKGROUND

With respect to electronics positioned within a module, the unintentional generation, propagation and reception of electromagnetic energy may inherently cause unwanted effects such as electromagnetic interference (EMI) which may adversely impact the operation of the electronics. Additionally, the EMI may physically damage the electronics. One objective for numerous electronic module manufacturers is to provide the correct operation of electronics in a common electromagnetic environment.

Additionally, various electronic based modules may be prone to exposure such as solids and liquids. Manufacturers of the modules describe their products as "dust resistant", "moisture proof", "weather resistant", and/or "waterproof". An Ingress Protection (IP) rating may be associated with the modules based on what level of design they can withstand dust, moisture, and liquids such as water. For example, these products may be designed to meet a standardized rating scale known as the IES Standard 60529 as established by the International Electrotechnical Commission (IEC). Thus, in this regard, it may be desirable to provide an electronics module that is both EMC compatible and that can meet various IP ratings to ensure that the electronics module operates properly in the presence of EMI, water, or other environmental elements.

SUMMARY

In at least one embodiment, an electronic module includes a first housing, a second housing, a printed circuit board (PCB), a ground contact, and a sealant. The first housing includes a first receiving portion. The second housing includes a second receiving portion, the second housing being coupled to the first housing defining a cavity positioned between the first receiving portion and the second receiving portion. The printed circuit board (PCB) is positioned between the first housing and the second housing therein to receive a plurality of electronics. The ground contact is positioned on the PCB and within the cavity contacting the first receiving portion and the second receiving portion. The ground contact mitigates electromagnetic interference (EMI) generated from the plurality of electronics. The sealant is positioned within the cavity and adjacent to the ground contact to prevent debris or liquid from contacting the plurality of electronics.

In at least one embodiment, an electronic module includes a first housing, a second housing, a printed circuit board (PCB), a ground contact, and a sealant. The first housing includes a first receiving portion. The second housing includes a second receiving portion, the second housing being coupled to the first housing and defining a cavity therebetween. The printed circuit board (PCB) is positioned between the first housing and the second housing therein to receive a plurality of electronics. The ground contact is positioned on the PCB and within the cavity contacting the first receiving portion and the second receiving portion to mitigate electromagnetic interference (EMI) generated from the plurality of electronics. The sealant is positioned within the cavity and adjacent to the ground contact to prevent liquid from contacting the plurality of electronics.

In at least one embodiment, an electronic module includes a first housing, a second housing, a printed circuit board (PCB), a ground contact, and a sealant. The first housing includes a first receiving portion. The second housing includes a second receiving portion, the second housing being coupled to the first housing and defining a cavity positioned therebetween. The printed circuit board (PCB) includes a first side and a second side. The PCB is positioned between the first housing and the second housing to receive a plurality of electronics. The ground contact is positioned on the first side and the second side of the PCB and within the cavity contacting the first receiving portion and the second receiving portion to mitigate electromagnetic interference (EMI) generated from the plurality of electronics. The sealant is positioned within the cavity and adjacent to the ground contact to prevent liquid from contacting the plurality of electronics.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

FIG. 1 generally depicts a first view of an electronics module in accordance with one embodiment;

FIG. 2 generally depicts a second view of the electronics module of FIG. 1 in accordance with one embodiment;

DETAILED DESCRIPTION

Figure 4:
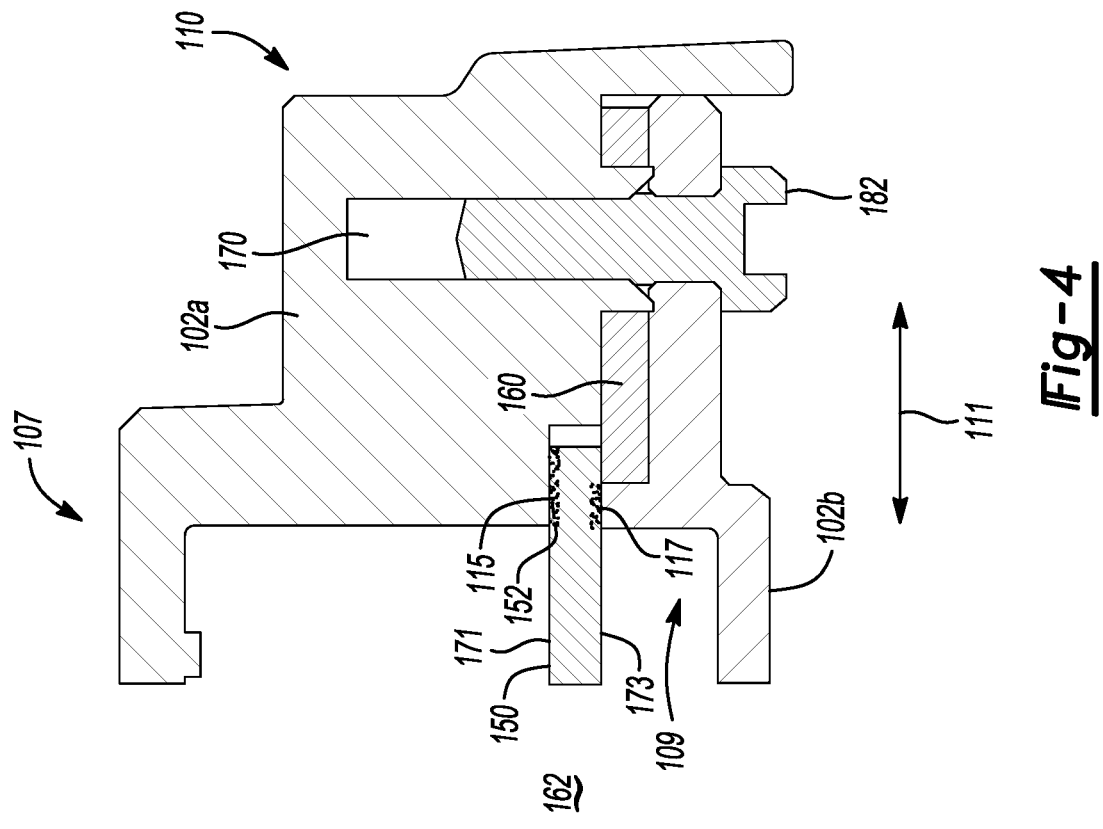
FIG. 4 depicts a second cross-sectional view of a second portion of the electronics module in accordance with one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Aspects disclosed herein generally provide for, but not limited to, a method for sealing an Ingress Protection (IP) rated water submersible electronics module while providing electromagnetic compatibility (EMC) mitigation. In general, the disclosed geometry for the sealing of the electronics module enables the module to meet the desired IP rating while also enabling intimate ground contact to a printed circuit board (PCB) that is positioned internally within the housing. The disclosed embodiments achieve optimal EMC and meets the desired IP rating, while minimizing the amount of real estate required to create an adequate submersion seal and reducing electromagnetic interference (EMI).

FIG. 1 generally depicts a first view of an electronics module 100 in accordance with one embodiment. In one example, the electronics module 100 may correspond to an audio player (or audio controller) that is configured to generate an audio output signal. In another example, the electronics module 100 may be an amplifier. It is recognized that the electronic module 100 may be utilized for any number of applications and that the module 100 is not limited to be utilized only for the purpose of providing an audio output or amplifying an audio input signal to generate the audio output. In another example, the electronics module 100 may be a controller that is positioned in a vehicle 101 that is equipped to support generating an audible chime which may be characterized as providing functionality to abide by Federal Motor Vehicle Safety Standards (FMVSS). Thus, in this regard, the electronics module 100 is required to meet the IP rating to withstand water submersion or intrusion while provide EMC mitigation.

The first view may generally correspond to a top view of the electronics module 100. The module 100 generally includes a housing 102, a plurality of electronics 104 embedded within the housing 102, and one or more mounting tabs 106a-106c ("106"). In one example, the housing 102 may be formed of two pieces. This aspect will be discussed in more detail below. The housing 102 also includes one or more connector regions 108a, 108b ("108") for receiving mating connectors (not shown) as positioned on a wire harness. It is recognized that the number of connector regions 108 implemented in the electronics module 100 may vary based on the desired criteria of a particular implementation. The housing 102 also defines a plurality of attachment portions 110a-110f ("110") for receiving respective attachment mechanisms (not shown in FIG. 1) (e.g., fasteners) to couple portions of the housing 102 to one another. The housing 102 may be positioned interior within the vehicle 101 such as for example in an instrument panel, center console, seat, etc. Conversely, the housing 102 may be positioned in exterior portions of the vehicle such as an engine compartment, trunk, door sill, etc.

Figure 3:
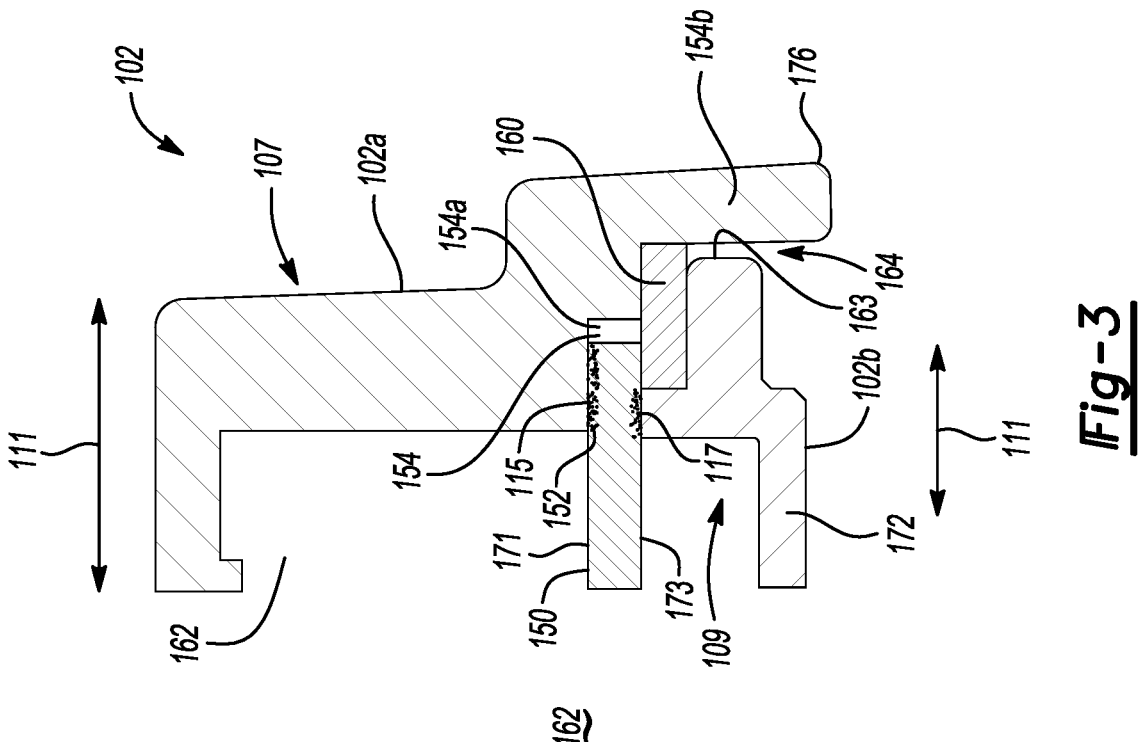
FIG. 3 depicts a first cross-sectional view of a first portion of the electronics module in accordance with one embodiment.

FIG. 2 generally depicts a second view of the electronics module 100 in accordance with one embodiment. The second view may correspond to an elevated and/or isometric view of the module 100. FIG. 3 generally depicts a first cross-sectional view of the housing 102 of the module 100 at a location 120 that is positioned between any two of the mounting tabs 106. The housing 102 may include a first housing 102a (or top housing (or first portion) 102a) and a second housing 102b (or bottom housing (or second portion) 102b)). The first housing 102a may be implemented as a heat sink to dissipate heat from the electronics module 100. For example, the plurality of electronics 104 as positioned within the electronics module 100 may generate heat that may need to be transferred away from the electronics module 100. The second housing 102b may be implemented as a cover. These aspects will be discussed further below.

A printed circuit board (PCB) 150 may be generally positioned between the first housing 102a and the second housing 102b. It is recognized that a plurality of electronics 104 (see FIGS. 1 and 5-6) may be positioned on one or more of a top and a bottom side of the PCB 150. The first housing 102a includes a first wall 107 and the second housing includes a second wall 109. A ground contact 152 (e.g., EMC ground contact) may be positioned about the PCB 150. The ground contact 152 may correspond to a bare trace (or exposed PCB trace). In another example, the ground contact 152 may be a solder bump. In the event the ground contact 152 is implemented as an exposed trace, such a exposed trace 152 may be positioned within the PCB 150. For example, the PCB 150 may comprise a plurality of layers (not shown) (e.g., FR4 layers) (or vias) upon which the exposed trace 152 may be embedded within the plurality of layers of the PCB 150. Similarly, and as shown in FIG. 3 (and FIG. 4), the exposed trace 152 may also extend through the layers of the PCB 150 and reside on a top side (e.g., first side 171) and a bottom side (e.g., second side 173) of the PCB 150. The first housing 102a and the second housing 102b may be made of, for example, metal. The ground contact 152 is generally configured to receive EMI generated by the plurality of electronics 104 and to serve as a ground for conducting such EMI to the first housing 102a and the second housing 102b to mitigate or remove the EMI from within the electronics module 100. The ground contact 152 mitigates EMI influence which may otherwise adversely affect the performance of the electronics module 100.

The first housing 102a includes a first wall 107 and a first receiving portion 115. The second housing 102b includes a second wall 109 and a second receiving portion 117. The first receiving portion 115 of the first housing 102a and the second receiving portion 117 of the second housing 102b. The first receiving portion 115 and the second receiving portion 117 generally define a cavity 154 when the first housing 102a and the second housing 102b are assembled to one another. The cavity 154 receives at least a portion of the PCB 150. A sealant (or a gasket) 160 may also be positioned in the cavity 154 to prevent debris (e.g., dust) and/or liquid from intruding into an inner chamber 162 of the housing 102. The ground contact 152 may be positioned within the cavity 154 formed by the first receiving portion 115 of the first housing 102a and the second receiving portion 117 of the second housing 102b. The PCB 150 and the sealant 160 extend along a planar axis 111 within the cavity 154. As shown, the PCB 150 and the sealant 160 are vertically offset from one another while positioned in the cavity 154. It is generally desirable to position the ground contact 152 as close as possible to the sealant 160. Thus, in this regard, the ground contact 152 is positioned directly adjacent to the sealant 160. It is generally advantageous to position the ground contact 152 directly adjacent to, or as close as possible to the sealant 160 to minimize packaging space for the electronics module 100. This also leads to a reduction in the size of the PCB and housing components. As can be seen, by increasing a distance between the ground contact 152 and the sealant 160, this results in the electronic module 100 increasing in overall size.

The ground contact 152 minimizes EMI generated by the plurality of electronics 104 by transferring such EMI to the first and second receiving portions 115 and 117 and the sealant 160 prevents fluid from intruding within an interior of the housing 102. As noted above, the ground contact 152 conducts (or grounds) the EMI generated by the plurality of electronics 104 by virtue of its contact with the first housing 102a and the second housing 102b to remove or minimize the presence of the EMI within the inner chamber 162.

As noted above, the first housing 102a and the second housing 102b generally form the cavity 154. The cavity 154 may have a first section 154a and a second section 154b. The first section 154a generally receives the PCB 150 and the second section 154b generally receives the sealant 160. As shown, the first section 154a and the second section 154b are generally axially offset from one another. The first housing 102a and the second housing 102b also define a disruptive path 164 that extends vertically along walls of the first and the second housing 102b, 102b. The first housing 102a includes a lip 176 that extends away from the PCB 150 and below a bottom surface 172 of the second housing 102b. In addition, the PCB 150 includes an end portion 163. The end portion 163 of the PCB 150 and the lip 176 define an opening (e.g., the disruptive path 164). In one aspect, the lip 176 is generally configured to extend below the bottom surface 172 of the second housing 102b to mitigate or prevent direct contact between water (or liquid) with the sealant 160. The disruptive path 164 may serve as a drain to enable any liquid that enters into the inner chamber 162 to drain therefrom. The disruptive path 164 may also be present to account for the assembly of the first housing 102a to the second housing 102b to one another. It is generally advantageous to minimize the size of the disruptive path 164. There has to be a gap for assembly and one objective is to minimize the size of the disruptive path as much as possible.

FIG. 4 depicts a second cross-sectional view of one or more of the attachment portions 110 of the module 100. The first housing 102a and the second housing 102b generally define an attachment cavity 170. In other words, each attachment portion 110 defines a corresponding attachment cavity 170 to receive a corresponding first attachment mechanism (e.g., fastener, etc.) 182 to couple the first housing 102a to the second housing 102b. The sealant 160 may be formed to surround the first attachment mechanism 182 to enable the first attachment mechanism 182 to pass freely into the attachment cavity 170.

Figure 5:
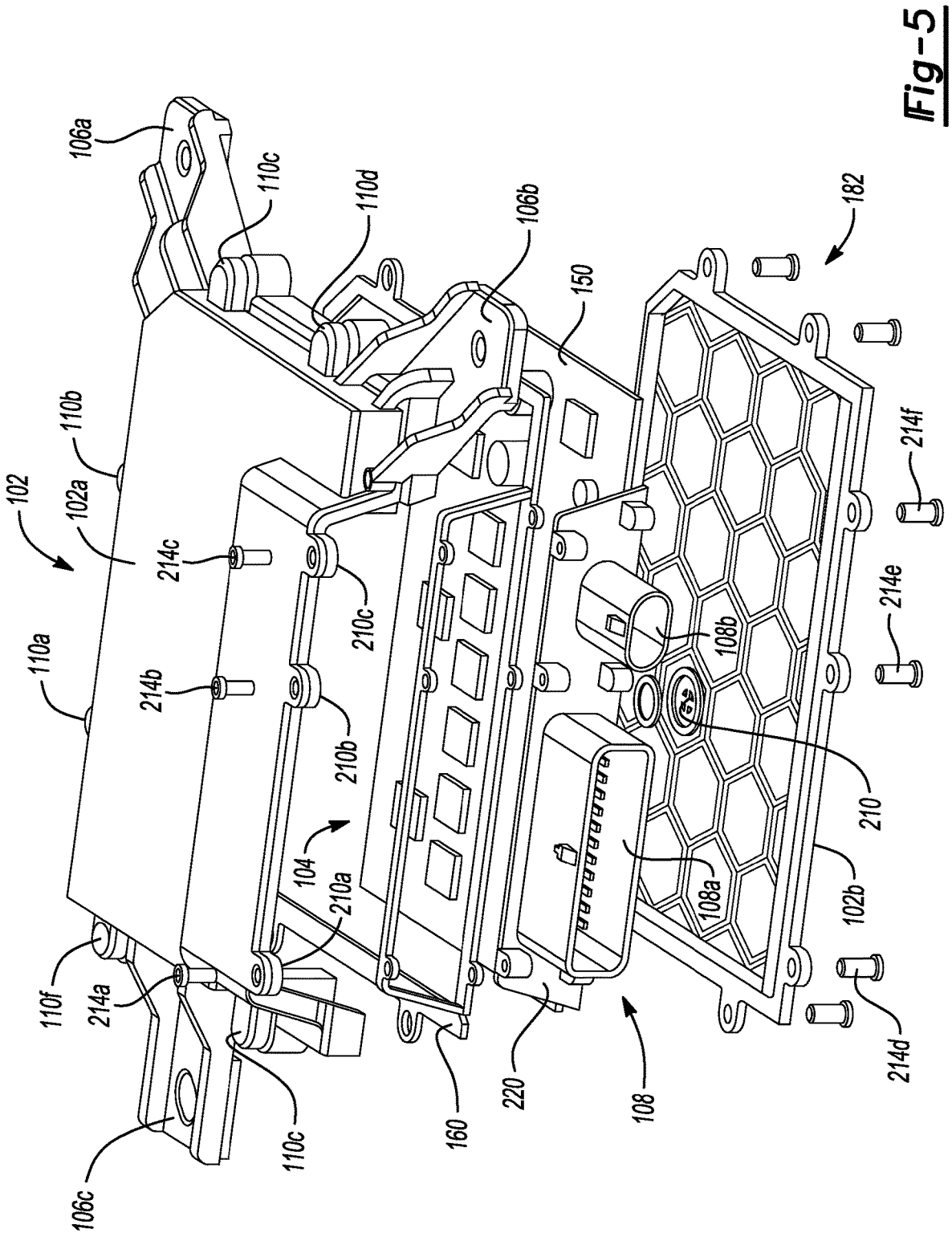
FIG. 5 depicts a first exploded view of the electronics module in accordance with one embodiment.

FIG. 5 depicts a first exploded view of the electronics module 100 in accordance with one embodiment. In general, the second housing 102b may be implemented as a cover and includes a vent 210 positioned thereon. The vent 210 is configured to mitigate a pressure differential between a pressure of fluid (e.g., air) within the electronics module 100 and fluid or ambient air that is exterior to the electronics module 100. In one example, the vent 210 allows air to pass into the inner chamber 162 of the module 100 and also allows air to flow from out of the inner chamber 162 of the module 100. FIG. 5 further illustrates a plurality of first attachment mechanisms 182 are provided for attaching the first housing 102a to the second housing 102b. For example, the electronics module 100 includes the corresponding attachment cavities 170 for receiving respective first attachment mechanisms 182.

In addition, the first housing 102a includes a plurality of receiving ports 210a-210c for receiving second attachment mechanisms 214a-214c. Similarly, the second housing 102b includes the plurality of receiving ports 210d-210f for receiving the second attachment mechanisms 214d-214f. A connector header 220 is provided that includes the connector regions 108a-108c positioned thereon. The plurality of receiving ports 210a-210c receive the second attachment mechanisms 214a-214c, respectively to couple the connector header 220 to the first housing 102a. Similarly, the plurality of receiving ports 210d-210f receive the second attachment mechanisms 214d-214f to couple the connection header 220 to the second housing 102b.

The sealant 160 may be, for example, a silicon-based gasket, a silicon-based liquid that is dispensed and cured within the electronics module 100, etc. As shown, the sealant 160 is positioned on an outer periphery of the PCB 150 to prevent fluid (e.g., water) intrusion into the inner chamber 162. In addition, the sealant 160 is arranged to also surround and outer periphery of the connector header 220 to seal such an area to prevent water intrusion given that the connector header 220 is a separate component from the first housing 102a and the second housing 102b. As noted above, the connector header 220 is coupled to the first housing 102a and the second housing 102b. Thus, the interface formed between the connector header 220, the first housing 102a and the second housing 102b may be exposed to environmental contaminants (i.e., fluid, etc.) and therefore such an interface requires the sealant 160 to prevent intrusion into the inner chamber 162. Similarly, as discussed above, the sealant 160 may also encircle or surround each of the first attachment mechanisms 182.

Figure 6:
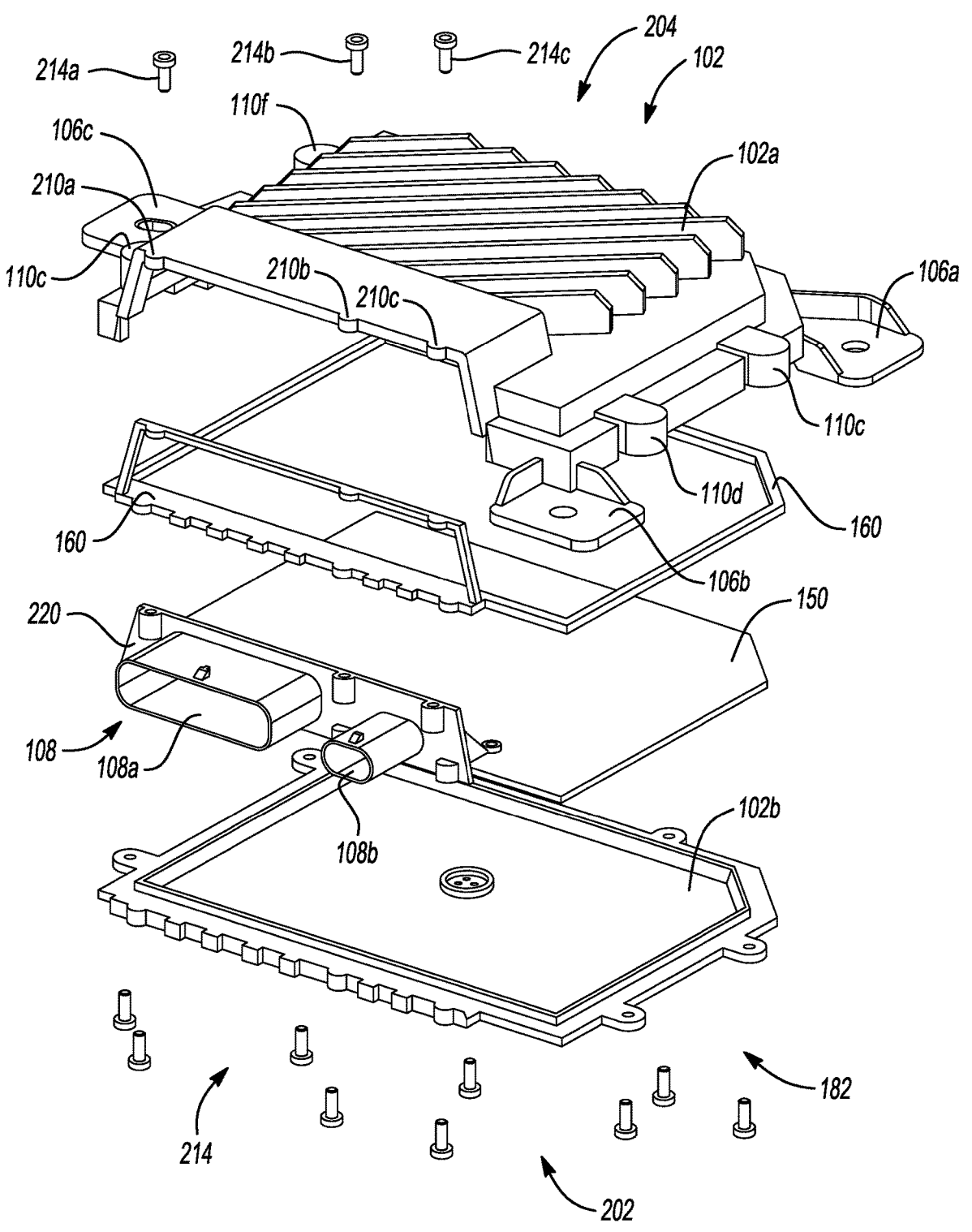
FIG. 6 depicts a second exploded view of the electronics module in accordance with embodiment.

FIG. 6 depicts a second exploded view of the electronics module 100 in accordance with embodiment. The electronics module 100 as illustrated in FIG. 6 is similar to the module 100 as shown in FIG. 5. However, first housing 102a of FIG. 6 is formed of a different exterior profile than that of the first housing 102a as illustrated in FIG. 5. In general, the first housing 102a of FIG. 6 has a different form factor than the first housing 102a as illustrated in FIG. 5.

A method for assembling the electronic module is also set forth herein. For example, the method may include providing a housing including a first housing and a second housing and positioning a PCB in the housing for receiving the one or more electronics. The method further includes positioning a sealant or a gasket within a cavity formed in the housing to prevent debris or liquid from contacting the PCB.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electronic module comprising:
   a first housing including a first receiving portion;
   a second housing including a second receiving portion, the second housing being coupled to the first housing defining a cavity positioned between the first receiving portion and the second receiving portion, the cavity having a first section and a second section, wherein the first section at least partially overlies the second section;
   a printed circuit board (PCB) positioned between the first housing and the second housing therein to receive a plurality of electronics;
   a ground contact positioned on the PCB and within the first section of the cavity contacting the first receiving portion and the second receiving portion, the ground contact mitigating electromagnetic interference (EMI) generated from the plurality of electronics; and
   a sealant positioned within the second section of the cavity and adjacent to the ground contact to prevent debris or liquid from contacting the plurality of electronics.

2. The electronic module of claim 1, wherein the sealant is positioned directly adjacent to the ground contact.

3. The electronic module of claim 1, wherein the sealant and the PCB extend along a planar axis in the cavity.

4. The electronic module of claim 3, wherein the sealant and the PCB are offset from one another while positioned in the cavity.

5. The electronic module of claim 1, wherein the PCB includes a first side and a second side, the second side being positioned opposite to the first side.

6. The electronic module of claim 5, wherein the ground contact is positioned on the first side and the second side of the PCB.

7. The electronic module of claim 5, wherein the ground contact extends through the PCB.

8. The electronic module of claim 1 further comprising a plurality of first attachment mechanisms to couple the first housing to the second housing.

9. The electronic module of claim 8, wherein the sealant completely surrounds each of the first attachment mechanisms.

10. An electronic module comprising:

a first housing including a first receiving portion;

a second housing including a second receiving portion, the second housing being coupled to the first housing and defining a cavity therebetween, the cavity having a first section and a second section, wherein the first section and the second section are planar and vertically offset from one another;

a printed circuit board (PCB) positioned between the first housing and the second housing therein to receive a plurality of electronics;

a ground contact positioned on the PCB and within the first section of the cavity contacting the first receiving portion and the second receiving portion to mitigate electromagnetic interference (EMI) generated from the plurality of electronics; and a sealant positioned within the second section of the cavity and adjacent to the ground contact to prevent liquid from contacting the plurality of electronics.

11. The electronic module of claim 10, wherein the sealant is positioned directly adjacent to the ground contact.

12. The electronic module of claim 10, wherein the sealant and the PCB extend along a planar axis in the cavity.

13. The electronic module of claim 12, wherein the sealant and the PCB are offset from one another while positioned in the cavity.

14. The electronic module of claim 10, wherein the PCB includes a first side and a second side, the second side being positioned opposite to the first side.

15. The electronic module of claim 14, wherein the ground contact is positioned on the first side and the second side of the PCB.

16. The electronic module of claim 14, wherein the ground contact extends through the PCB.

17. The electronic module of claim 10 further comprising a plurality of first attachment mechanisms to couple the first housing to the second housing.

18. The electronic module of claim 17, wherein the sealant completely surrounds each of the first attachment mechanisms.

19. An electronic module comprising:

a first housing including a first receiving portion;

a second housing including a second receiving portion, the second housing being coupled to the first housing and defining a cavity positioned therebetween, the cavity having a first section and a second section, wherein the first section at least partially overlies the second section;

a printed circuit board (PCB) including a first side and a second side, the PCB being positioned between the first housing and the second housing therein to receive a plurality of electronics;

a ground contact positioned on the first side and the second side of the PCB and within the first section of the cavity contacting the first receiving portion and the second receiving portion to mitigate electromagnetic interference (EMI) generated from the plurality of electronics; and a sealant positioned within the second section of the cavity and adjacent to the ground contact to prevent liquid from contacting the plurality of electronics.

20. The electronic module of claim 19, wherein the sealant is positioned directly adjacent to the ground contact.

* * * * *